(12) United States Patent
Eden et al.

(10) Patent No.: US 7,477,017 B2
(45) Date of Patent: Jan. 13, 2009

(54) AC-EXCITED MICROCAVITY DISCHARGE DEVICE AND METHOD

(75) Inventors: J. Gary Eden, Mahomet, IL (US); Kuo-Feng Chen, Urbana, IL (US); Nels P. Ostrom, Champaign, IL (US); Sung-Jin Park, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 443 days.

(21) Appl. No.: 11/042,228

(22) Filed: Jan. 25, 2005

(65) Prior Publication Data

US 2008/0290799 A1     Nov. 27, 2008

(51) Int. Cl.
*H01J 17/49* (2006.01)

(52) U.S. Cl. .................... 313/582; 313/586; 313/631; 445/24

(58) Field of Classification Search ......... 313/582–587, 313/631
See application file for complete search history.

(56) References Cited

U.S. PATENT DOCUMENTS

| | | | |
|---|---|---|---|
| 3,487,254 A | 12/1969 | Vollmer | |
| 3,697,797 A | 10/1972 | Freyheit et al. | |
| 3,793,552 A | 2/1974 | Glascock et al. | |
| 3,908,147 A | 9/1975 | Hall et al. | |
| 3,970,887 A | 7/1976 | Smith et al. | |
| 4,060,748 A | 11/1977 | Bayless | |
| 4,110,775 A | 8/1978 | Festa | |
| 4,329,626 A | 5/1982 | Hillenbrand et al. | |
| 4,367,554 A | 1/1983 | Schlossberg | |
| 4,370,797 A | 2/1983 | van Gorkom et al. | |
| 4,459,636 A | 7/1984 | Meister et al. | |

(Continued)

FOREIGN PATENT DOCUMENTS

EP     1486775     12/2004

(Continued)

OTHER PUBLICATIONS

U.S. Appl. No. 60/930,393, filed May 2007, Eden.

(Continued)

*Primary Examiner*—Nimeshkumar D. Patel
*Assistant Examiner*—Donald L Raleigh
(74) *Attorney, Agent, or Firm*—Greer, Burns & Crain, Ltd.

(57) ABSTRACT

A method for fabricating microcavity discharge devices and arrays of devices. The devices are fabricated by layering a dielectric on a first conducting layer. A second conducting layer or structure is overlaid on the dielectric layer. In some devices, a microcavity is created that penetrates the second conducting layer or structure and the dielectric layer. In other devices, the microcavity penetrates to the first conducting layer. The second conducting layer or structure together with the inside face of the microcavity is overlaid with a second dielectric layer. The microcavities are then filled with a discharge gas. When a time-varying potential of the appropriate magnitude is applied between the conductors, a microplasma discharge is generated in the microcavity. These devices can exhibit extended lifetimes since the conductors are encapsulated, shielding the conductors from degradation due to exposure to the plasma. Some of the devices are flexible and the dielectric can be chosen to act as a mirror.

32 Claims, 15 Drawing Sheets

U.S. PATENT DOCUMENTS

| | | | |
|---|---|---|---|
| 4,475,060 A | 10/1984 | Aboelfotoh | |
| 4,638,218 A | 1/1987 | Shinoda et al. | |
| 4,672,624 A | 6/1987 | Ford | |
| 4,698,546 A | 10/1987 | Maitland et al. | |
| 4,720,706 A | 1/1988 | Stine | |
| 4,724,356 A | 2/1988 | Daehler | |
| 4,728,864 A | 3/1988 | Dick | |
| 4,803,402 A | 2/1989 | Raber et al. | |
| 4,808,883 A | 2/1989 | Iwaya et al. | |
| 4,843,281 A | 6/1989 | Mendelsohn | |
| 4,858,062 A | 8/1989 | Hayakawa et al. | |
| 4,890,031 A | 12/1989 | Zwier | |
| 4,956,577 A | 9/1990 | Parker | |
| 4,988,918 A | 1/1991 | Mori et al. | |
| 4,992,703 A | 2/1991 | Ramaiah | |
| 5,013,902 A | 5/1991 | Allard | |
| 5,055,979 A | 10/1991 | Boland et al. | |
| 5,062,116 A | 10/1991 | Christensen | |
| 5,132,811 A | 7/1992 | Iwaki et al. | |
| 5,144,527 A | 9/1992 | Amano et al. | |
| 5,164,633 A | 11/1992 | Kim et al. | |
| 5,200,973 A | 4/1993 | Ford | |
| 5,387,805 A | 2/1995 | Metzler et al. | |
| 5,438,343 A | 8/1995 | Khan et al. | |
| 5,496,199 A | 3/1996 | Makishima et al. | |
| 5,508,234 A * | 4/1996 | Dusablon et al. | 216/2 |
| 5,514,847 A | 5/1996 | Makishima et al. | |
| 5,625,250 A * | 4/1997 | Pribat et al. | 313/309 |
| 5,626,772 A | 5/1997 | Bongaerts et al. | |
| 5,686,789 A | 11/1997 | Schoenbach et al. | |
| 5,691,608 A | 11/1997 | Yamamoto et al. | |
| 5,723,945 A | 3/1998 | Schermerhorn | |
| 5,926,496 A | 7/1999 | Ho et al. | |
| 5,939,829 A | 8/1999 | Schoenbach et al. | |
| 5,955,828 A | 9/1999 | Sadwick et al. | |
| 5,969,378 A | 10/1999 | Singh | |
| 5,984,747 A | 11/1999 | Bhagavatula et al. | |
| 5,986,409 A | 11/1999 | Farnworth et al. | |
| 5,990,620 A | 11/1999 | Lepselter | |
| 6,016,027 A | 1/2000 | DeTemple et al. | |
| 6,043,604 A | 3/2000 | Horiuchi et al. | |
| 6,051,923 A | 4/2000 | Pong | |
| 6,072,273 A | 6/2000 | Schoenbach et al. | |
| 6,082,294 A | 7/2000 | Simpson | |
| 6,097,145 A | 8/2000 | Kastalsky et al. | |
| 6,139,384 A | 10/2000 | DeTemple et al. | |
| 6,147,349 A | 11/2000 | Ray | |
| 6,194,833 B1 * | 2/2001 | DeTemple et al. | 313/631 |
| 6,217,833 B1 | 4/2001 | Kolu | |
| 6,239,547 B1 | 5/2001 | Uemura et al. | |
| 6,333,598 B1 | 12/2001 | Hsu et al. | |
| 6,346,770 B1 | 2/2002 | Schoenbach et al. | |
| 6,353,289 B1 | 3/2002 | Ishigami et al. | |
| 6,433,480 B1 | 8/2002 | Stark et al. | |
| 6,456,007 B1 | 9/2002 | Ryu et al. | |
| 6,459,201 B1 | 10/2002 | Schermerhorn et al. | |
| 6,538,367 B1 | 3/2003 | Choi et al. | |
| 6,541,915 B2 | 4/2003 | Eden et al. | |
| 6,548,962 B1 | 4/2003 | Shiokawa et al. | |
| 6,563,257 B2 | 5/2003 | Vojak et al. | |
| 6,597,120 B1 | 7/2003 | Schemerhorn et al. | |
| 6,626,720 B1 | 9/2003 | Howard et al. | |
| 6,657,370 B1 | 12/2003 | Geusic | |
| 6,695,664 B2 * | 2/2004 | Eden et al. | 445/24 |
| 6,815,891 B2 | 11/2004 | Eden et al. | |
| 6,825,606 B2 | 11/2004 | Schermerhorn et al. | |
| 6,828,730 B2 | 12/2004 | Eden et al. | |
| 6,867,548 B2 | 3/2005 | Eden et al. | |
| 7,026,640 B2 | 4/2006 | Nathan et al. | |
| 7,112,918 B2 | 9/2006 | Eden | |
| 7,126,266 B2 | 10/2006 | Park et al. | |
| 2002/0030437 A1 | 3/2002 | Shimizu et al. | |
| 2002/0036461 A1 | 3/2002 | Schoenbach et al. | |
| 2003/0030374 A1 | 2/2003 | Pai | |
| 2003/0080688 A1 | 5/2003 | Eden et al. | |
| 2003/0132693 A1 | 7/2003 | Eden et al. | |
| 2003/0230983 A1 | 12/2003 | Vonallmen | |
| 2004/0100194 A1 | 5/2004 | Eden et al. | |
| 2004/0134778 A1 | 7/2004 | Stelzle et al. | |
| 2004/0144733 A1 | 7/2004 | Cooper et al. | |
| 2005/0136609 A1 | 6/2005 | Mosley et al. | |
| 2005/0142035 A1 | 6/2005 | Bonne et al. | |
| 2005/0148270 A1 | 7/2005 | Eden et al. | |
| 2005/0269953 A1 | 12/2005 | Eden | |
| 2006/0038490 A1 | 2/2006 | Eden | |
| 2006/0071598 A1 | 4/2006 | Eden | |
| 2006/0082319 A1 | 4/2006 | Eden | |
| 2006/0084262 A1 * | 4/2006 | Qin | 438/619 |
| 2006/0196424 A1 | 9/2006 | Swallow et al. | |
| 2007/0017636 A1 | 1/2007 | Goto et al. | |
| 2007/0108910 A1 | 5/2007 | Eden et al. | |
| 2007/0170866 A1 | 7/2007 | Eden | |

FOREIGN PATENT DOCUMENTS

| | | |
|---|---|---|
| JP | 63-174239 | 7/1988 |
| JP | 7192701 | 7/1995 |
| JP | 08106852 | 4/1996 |
| JP | 2004-99400 | 2/2004 |
| WO | WO 2004/032176 | 4/2004 |

OTHER PUBLICATIONS

J.J. Chiu et al., "Organic Semiconductor Nanowires for Field Emission", *Advanced Materials*, vol. 15, No. 16, Aug. 15, 2003, pp. 1361-1364.

J. Katz et al., "Diffraction Coupled Phase-Locked Semiconductor Laser Array", *Appl. Phys. Lett.*, vol. 42, No. 7, Apr. 1, 1983, pp. 554-556.

Y.H. Lee et al., "Tungsten Nanowires and their Field Electron Emission Properties", *Applied Physics Letters*, vol. 81, No. 4, Jul. 22, 2002, pp. 745-747.

C.J. Lee et al., "Field Emission from Well-Aligned Zinc Oxide Nanowires Grown at Low Temperature", *Applied Physics Letters*, vol. 81, No. 19, Nov. 4, 2002, pp. 3648-3650.

L.A. Newman, "High Power Coupled $CO_2$ Waveguide Laser Array", *Appl. Phys. Lett.*, vol. 48, No. 25, Jun. 23, 1986, pp. 1701-1703.

M. Oka et al., "Laser-Diode-Pumped Phase-Locked Nd: YAG Laser Arrays", *IEEE Journal of Quantum Electronics*, vol. 28, No. 4, Apr. 1992, pp. 1142-1147.

S.J. Park et al., "Integration of Carbon Nanotubes with Microplasma Device Cathodes: Reduction in Operating and Ignition Voltages", *Electronics Letters*, vol. 40, No. 9, Apr. 29, 2004.

S.J. Park et al., "Stable Microplasmas in Air Generated with a Silicon Inverted Pyramid Plasma Cathode", *IEEE Transactions on Plasma Science*, vol. 33, No. 2, Apr. 2005, pp. 570-571.

J.E. Ripper et al., "Optical Coupling of Adjacent Stripe-Geometry Junction Lasers", *Applied Physics Letters*, vol. 17, No. 9, Nov. 1, 1970, pp. 371-373.

C. Tang et al., "Effect of BN Coatings on Oxidation Resistance and Field Emission of SiC Nanowires", *Applied Physics Letters*, vol. 83, No. 4., Jul. 28, 2003, pp. 659-661.

Z.S. Wu et al., "Needle-shaped Silicon Carbide Nanowires: Synthesis and Field Electron Emission Properties", *Applied Physics Letters*, vol. 80, No. 20, May 20, 2002, pp. 3829-3831.

D.G. Youmans, "Phase Locking of Adjacent Channel Leaky Waveguide $CO_2$ Lasers", *Appl. Phys. Lett.*, vol. 44, No. 4, Feb. 15, 1984, pp. 365-367.

J. Zhou et al., "Large-Area Nanowire Arrays of Molybdenum and Molybdenum Oxides: Synthesis and Field Emission Properties", *Advanced Materials*, vol. 15, No. 21, Nov. 4, 2003, pp. 1835-1840.

A.. El-Habachi, et al., Sep. 15, 2000, "Series operation of direct current xenon chloride excimer sources," Journal of Applied Physics, vol. 88, No. 6, pp. 3220-3224.

K. H. Schoenbach, et al, Jan. 1996, "Microhollow cathode discharges," Appl. Phys. Lett., vol. 68, No. 1, pp. 13-15.

L. D. Biborosch, et al, Dec. 20, 1999, "Microdischarges with plane cathodes," Appl. Phys. Lett., vol. 75, No. 25, Dec. 20, 1999, pp. 3926-3928.

S. J. Park, et al, Jul. 10, 2000, "Flexible microdischarge arrays: Metal/polymer devices", Applied Physics Letters, vol. 77, No. 2, pp. 199-201.

J.W. Frame et al., Sep. 1997, "Microdischarge devices fabricated in silicon", Applied Physics Letters, vol. 71, No. 9, pp. 1165-1167.

J.W. Frame, et al., May 25, 1998, "Continuous-wave emission in the ultraviolet from diatomic excimers in a microdischarge", Applied Physics Letters, vol. 72, No. 21, pp. 2634-2636.

J.W. Frame et al., Jul. 23, 1998, "Planar microdischarge arrays", Electronics Letters, vol. 34, No. 15, pp. 1529-1531.

Karl H. Schoenbach et al, Jun. 30, 1997, "High-pressure hollow cathode discharges;"; Plasma Sources Sci Technical., pp. 468-477.

A. El-Habachi, et al, Jan. 5, 1998, "Emission of excimer radiation from direct current, high-pressure hollow cathode discharges;"; App. Phys. Lett. 72 (1), pp. 22-24.

S. J. Park et al., Jan. 2001, "Performance of microdischarge devices and arrays with screen electrodes," IEEE Photon, Tech. Lett., vol. 13, pp. 61-63.

C. J. Wagner, et al., Feb. 12, 2001, "Excitation of a microdischarge with a reverse-biased pn junction," Appl. Phys. Lett., vol. 78, pp. 709-711.

S. J. Park et al., Sep. 24, 2001, "Independently addressable subarrays of silicon microdischarge devices: Electrical characteristics of large (30×30) arrays and excitation of a phosphor," Appl. Phys. Lett., vol. 79, pp. 2100-2102.

B.A.Voyak, et al., Mar. 5, 2001, "Multistage, monolithic ceramic microdischarge device having an active length of -0.27 mm," Appl. Phys. Lett., vol. 78, No. 10, pp. 1340-1342.

R. H. Stark et. al., Feb. 15, 1999, "Direct current high-pressure plow discharges", J. Appl. Phys. vol. 85, pp. 2075-2080.

J.F. Waymouth, Dec. 1991, "LTE and Near-LTE Lighting Plasmas", IEEE Transaction on Plasma Science, Vo. 19 No. 6 pp. 1003-1012.

A.D. White, May 1959, "New Hollow Cathode Glow Discharge", Journal of Applied Physics, vol. 30, No. 5, pp. 711-719.

L.C. Ptichford, et al., Jul. 1997, "The breakdown and glow phases during the initiation of discharges for lamps", J. Appl. Phys. 82, (1) pp. 112-119.

S. J.Park et al., Feb. 1, 2001, "Arrays of microdischarge devices having 50-100um square pyramidal Si anodes and screen cathodes," 1 Electron. Lett. vol. 37 No. 3, pp. 171-172.

J.G. Eden et al., Nov. 2003, "Microplasms devices fabricated in silicon, ceramic, and metal/polymer structures: arrays, emitters and photodetectors," Journal of Physics D: Applied Physics 36, pp. 2869-2877.

S. J. Park et al., May 31, 2004, "Carbon nanotube-enhanced performance of microplasma devices," Applied Physics Letters, pp. 4481-4483, vol. 84, No. 22.

H. Masuda; et al., Jun. 9, 1995, "Ordered Metal Nanohole Arrays Made by a Two-Step Replication of Honeycomb Structures of Anodic Alumina", Science, New Series, vol. 268, No. 5216, 1466-1468.

O. Jessensky et al., Mar. 9, 1998, "Self-organized formation of hexagonal pore arrays in anodic alumina", Applied Physics Letters, vol. 72 No. 10., 1173-1175.

R. H. Stark et al., Jun. 21, 1999, "Direct current glow discharges in atmospheric air," Appl. Phys. Lett., vol. 74, pp. 3770-3772.

S.-J. Park et al., Jan. 22, 2001, "Silicon microdischarge devices having inverted pyramidal cathodes: Fabrication and performance of arrays," Appl. Phys. Lett., vol. 78, pp. 419-421.

A.-A. H. Mohamed, et al., Feb. 2002, "Direct current glow discharges in atmospheric air," IEEE Trans. Plasma Sci., vol. 30, pp. 182-183.

* cited by examiner

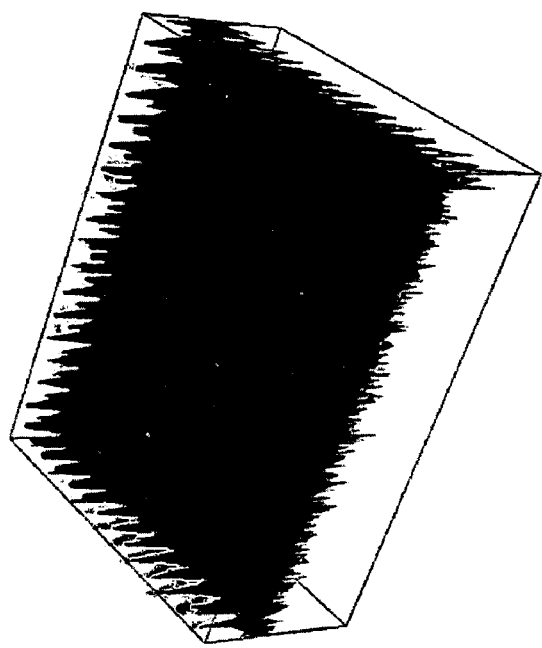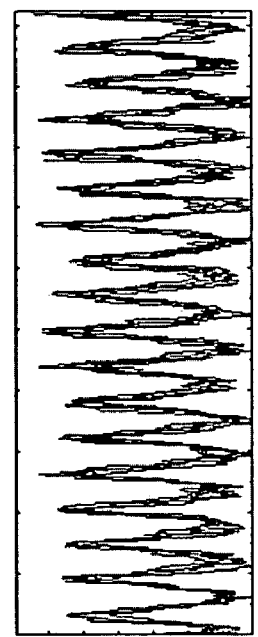
Fig. 8

AC-EXCITED MICROCAVITY DISCHARGE DEVICE AND METHOD

STATEMENT OF GOVERNMENT INTEREST

This invention was made with Government support under Contract Number F49620-03-1-0391 awarded by the Air Force Office of Scientific Research (AFOSR). The Government has certain rights in this invention.

TECHNICAL FIELD

The present invention relates to microdischarge devices and, in particular, to methods for fabricating AC-excited devices and arrays.

BACKGROUND

Microplasma (microdischarge) devices have been under development for almost a decade and devices having microcavities as small as 10 µm have been fabricated. (A microcavity is a cavity having a characteristic dimension (diameter, length of a rectangle, etc.) of approximately 500 µm or less.) Arrays of microplasma devices as large as $4\times10^4$ pixels in ~4 $cm^2$ of chip area, for a packing density of $10^4$ pixels per $cm^2$, have been fabricated. Furthermore, applications of these devices in areas as diverse as photodetection in the visible and ultraviolet, environmental sensing, and plasma etching of semiconductors have been demonstrated and several are currently being explored for commercial potential. Many of the microplasma devices reported to date have been driven by DC voltages and have incorporated dielectric films of essentially homogeneous materials.

Regardless of the application envisioned for microplasma devices, the success of this technology will hinge on several factors, of which the most important are manufacturing cost, lifetime, and radiant efficiency. A method of device fabrication that addresses manufacturing cost and lifetime while simultaneously providing for large arrays of devices is, therefore, highly desirable.

SUMMARY OF THE INVENTION

In a first embodiment of the invention, a microdischarge device is provided that includes a conducting substrate with one or more microcavities opening to a first face of the substrate. The conducting substrate may be, for example, a semiconductor, metal or a conducting polymer. An electrical contact is coupled to a second (or first) face of the substrate, forming a first electrode. A dielectric layer or layers substantially covers the first face of the substrate and the interior surface of the microcavity. A second electrode is disposed distally to the dielectric layer, with the term "distally" denoting disposition on the side of the dielectric layer opposite from the substrate. A time-varying potential is applied across the first and second electrodes. In some embodiments, the dielectric layer may include a first dielectric layered on a second dielectric. In other embodiments, an additional dielectric layer may be deposited, substantially covering the second electrode.

In another embodiment of the invention, a method for manufacturing a microdischarge device or an array of devices is provided. The method includes providing a conducting substrate with a microcavity. The microcavity includes an opening to a first face of the substrate. The conducting substrate may be a semiconductor, a metal, a conducting polymer, or a polymer coated with, or bonded to, a conducting film or sheet. An electrical contact is connected to a second (or first) face of the substrate, forming a first electrode, and a first dielectric layer is deposited on the first face of the substrate. A second electrode is provided adjacent to the microcavity opening and disposed distally to the first dielectric layer. The microcavity is filled with a specified discharge gas or vapor. In a specific embodiment, the microcavity extends to the second face of the substrate. In some embodiments, a second dielectric layer may be deposited, substantially covering the second electrode as well as the wall of the microcavity. In some embodiments the second electrode may be a screen or a conducting film.

In a further embodiment of the invention, a microdischarge device is provided. The device includes a dielectric substrate with two faces. The substrate is coated with a conducting layer on each face. At least one microcavity is formed in the substrate. This microcavity may extend to the other conducting layer. Electrical contacts are coupled to the conducting layers on each face of the substrate, forming electrodes. A time-varying potential of the appropriate magnitude applied across the electrodes can ignite a microplasma in the microcavity. This microdischarge device may advantageously be flexible in at least one direction.

In another embodiment of the invention, a method is provided for manufacturing a flexible microdischarge device. The method includes providing a dielectric substrate coated with a conducting layer on each face; forming a microcavity in the first face of the substrate; and connecting an electrical contact to each conducting layer. The microcavity is then filled with a specified discharge gas or vapor. In a specific embodiment of the invention, the method further includes the ability to flex the device in at least one direction.

BRIEF DESCRIPTION OF THE DRAWINGS

The foregoing features of the invention will be more readily understood by reference to the following detailed description, taken with reference to the accompanying drawings, in which:

FIG. 8 is a false color image (top) of the intensity contour produced by a 17×13 pixel segment of a 200×200 pixel array, fabricated according to the process of FIG. 1, and the lower portion of the figure shows the superposition of several lineouts from the two dimensional intensity contour;

DETAILED DESCRIPTION OF SPECIFIC EMBODIMENTS

As used in this description and in any appended claims, "layers" may be formed in a single step or in multiple steps (e.g., depositions). One layer or structure may be formed or layered on another structure or layer without being directly adjacent to, or in contact with, the other structure or layer.

In certain embodiments of the invention, a microcavity discharge device is obtained by overcoating with a dielectric layer (or layers) a first face of a conducting (or semiconducting) substrate into which a microcavity is formed. A first electrode is disposed distally to the dielectric layer, adjacent to the microcavity opening. The first electrode is overcoated with another dielectric layer. Electrical contact is made to the substrate, forming a second electrode. The microcavity (or microcavities) is backfilled with a discharge gas or vapor and then sealed. A microplasma discharge can be ignited in the microcavity when a time-varying (AC, pulsed DC, etc.) excitation potential of the appropriate magnitude is applied between the two electrodes. These devices can have considerably extended lifetimes as compared to conventional devices because electrode erosion can be negligible and the dielectric coatings will, if chosen properly, be resistant to chemical erosion and, if desired, reflective over a particular wavelength region. Further, when the substrate is a semiconductor, the substrate may be precisely fashioned by VLSI processing techniques.

Figure 1:
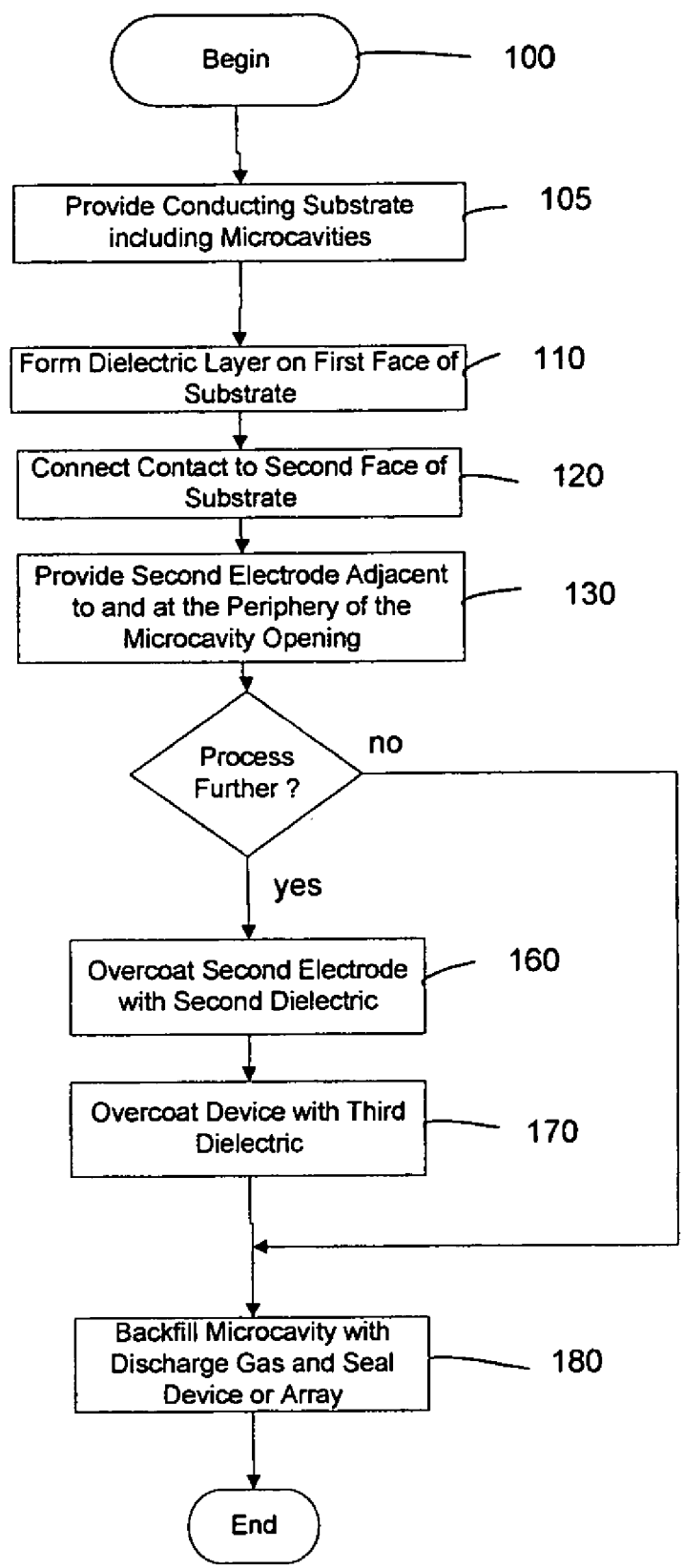
FIG. 1 shows a flow diagram of a process for fabricating a microdischarge device according to an embodiment of the present invention.
Figure 2:
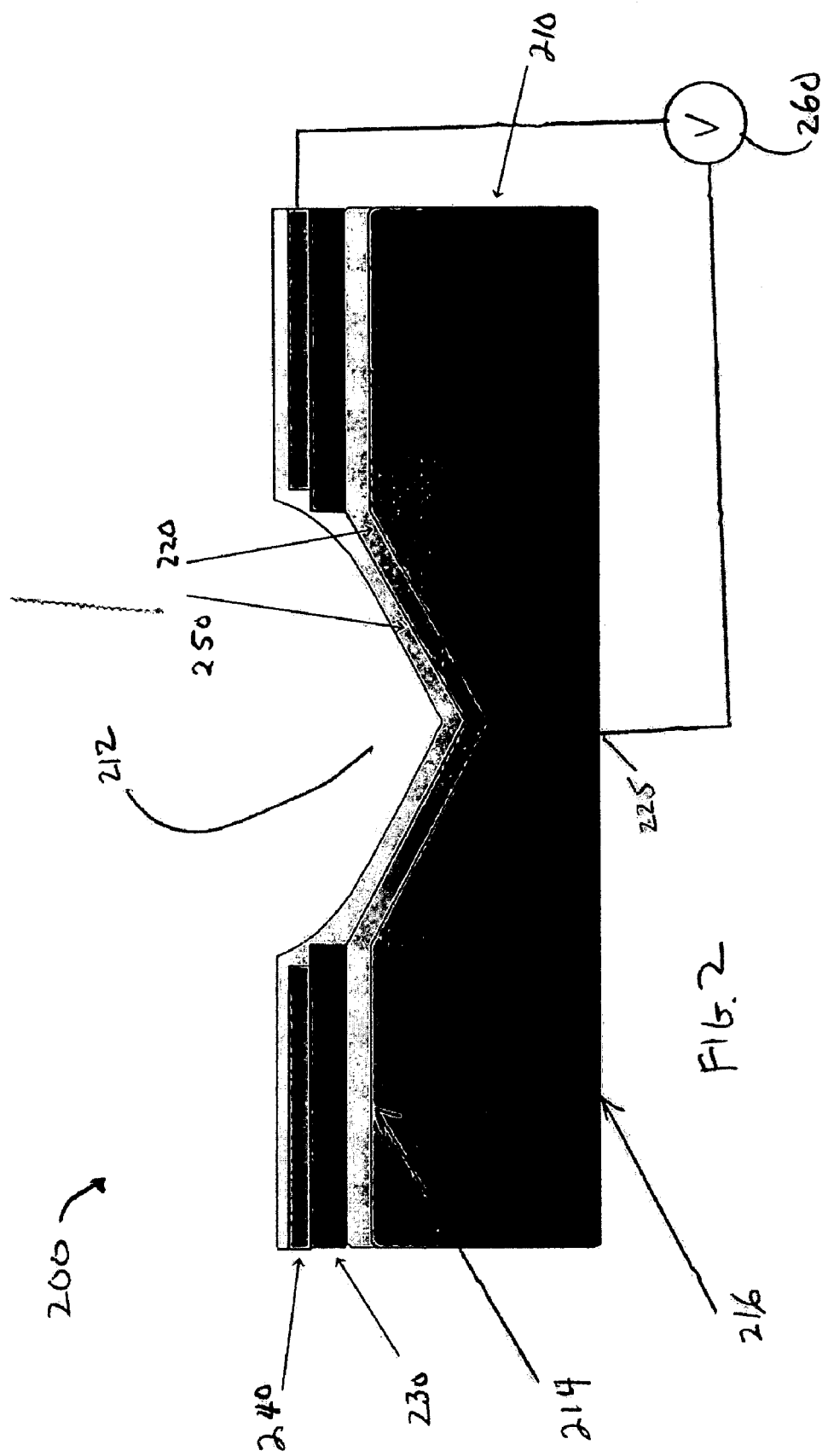
FIG. 2 shows in cross-section a device made by the process of FIG. 1.

In an embodiment of the invention, a process is provided for fabricating a microdischarge device. A flow diagram for the process is shown in FIG. 1. FIG. 2 illustrates the structure of an exemplary device 200 fabricated by the process. A conducting (or semiconducting) substrate 210 is provided that includes a microcavity 212. The substrate includes first 214 and second 216 faces and the microcavity 212 opens to the first face of the substrate. In some embodiments, the microcavity may also extend to the second face 216 of the substrate. The substrate may be a semiconductor, such as a p-type wafer of Si ($\rho$~6-8 $\Omega$-cm), (where "$\rho$" is resistivity), a metal or a metal/polymer structure. In a specific embodiment of the invention, an inverted pyramidal microcavity is etched in the substrate by wet processing. In other embodiments of the invention, a wide variety of microcavities 212 having different cross-sectional geometries can be fabricated. A first dielectric layer 220 (typically 1 µm or more in thickness), which may be $Si_3N_4$ or $SiO_2$, is formed 110 on the first face 214 of the substrate including the interior surface of the microcavity. An electrical contact 225 is connected 120 to the second face (backside) 216 of the substrate, forming a first electrode. If the first dielectric layer 220 has been formed over the entire substrate, the substrate is first etched on the second face to permit electrical contact to the substrate. A second electrode 240 is then provided 130, adjacent to the microcavity opening and distal (with respect to the substrate) to the first dielectric layer 220.

In a specific embodiment of the invention, the second electrode may be a conductor, such as Ni, deposited on the first dielectric layer, adjacent to the microcavity opening and a second dielectric layer 250, such as silicon nitride, may be formed 160 on the second electrode, encapsulating the electrode and thereby prolonging the life of the device. In another specific embodiment of the invention, this second electrode can take on a variety of forms (screen, conducting polymer or semiconductor film, etc.). Electrodes in these forms can also be covered by one or more dielectric layers to further prolong the life of the device. Irrespective of the microcavity geometry chosen, minimizing the surface roughness of the cavity walls and the final dielectric surface within the microcavity is an important consideration.

In another specific embodiment of the invention, an additional dielectric layer 230, such as polyimide, may be deposited 170 on the first dielectric layer before the conductor, which forms the second electrode, is deposited. An additional dielectric layer, such as silicon nitride, can be deposited onto any of the above described structures of the device, if desired.

After any of the device structures described above are formed, the device may be evacuated by a vacuum system and may be heated under vacuum to de-gas the structure. Subsequently, the microcavity (or microcavities) in the device (or array of devices) may be backfilled 180 with a desired gas or vapor, or a mixture of gases and vapors. It is then generally desirable to seal the device or array by one of a variety of well-known processes such as anodic bonding, lamination or sealing with glass frit or epoxy. A microplasma discharge may be ignited in the cavity by applying a time-varying (AC, pulsed DC, bipolar, etc.) excitation potential 260 between the electrodes.

In a specific embodiment of the invention, wet chemical etching of Ge yields microcavities that are trapezoidal (slanted sidewalls and a flat bottom) or triangular (i.e., pyramidal microcavities) in cross-section. Furthermore, trapezoidal cross-section microcavities can be formed in Si as well.

Figure 3:
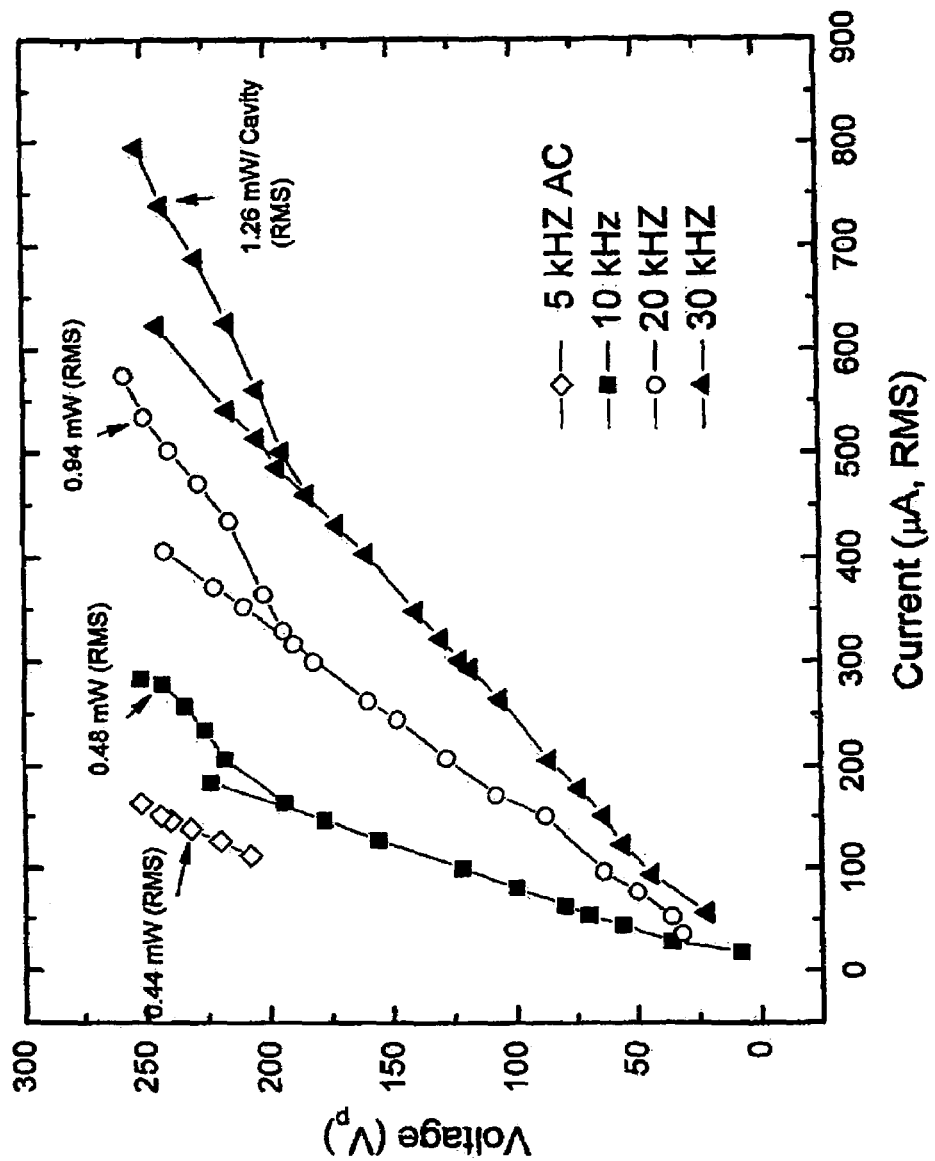
FIG. 3 is a graph of voltage-current (V-I) characteristics for 10×10 pixel arrays of the device of FIG. 2, filled with Ne gas at 600 Torr.
Figure 4:
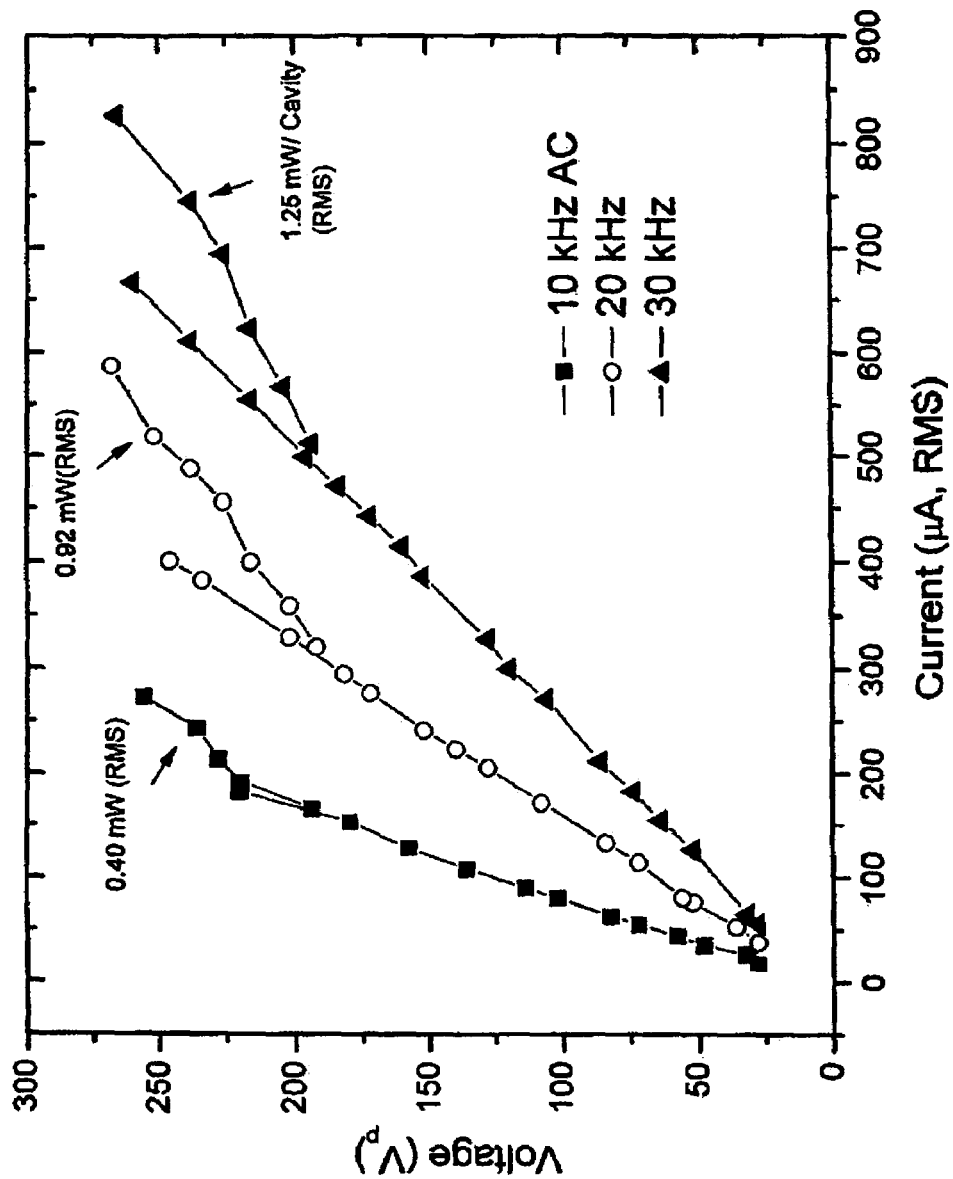
FIG. 4 is a graph of voltage-current (V-I) characteristics for 10×10 pixel arrays of the device of FIG. 2, filled with Ne gas at 700 Torr.

Microdischarge devices have been fabricated using the process of FIG. 1, both as single pixels and as arrays. The arrays are considerably more uniform (in emission intensity) and better behaved as compared to earlier devices which were generally DC-excited and did not have a dielectric coating on the semiconductor electrode. FIGS. 3 and 4 show voltage-current (V-I) characteristics for 10×10 pixel arrays of 50×50 $\mu m^2$ inverted pyramid Si devices in which the Si electrode is overcoated with a dielectric. However, the second dielectric layer 250 has not been added.

The data of FIG. 3 are for operation with 600 Torr of Ne whereas, in FIG. 4, the Ne pressure is 700 Torr. Note that no external ballast is required. Data are shown for several different frequencies of a bipolar voltage waveform and electrical breakdown occurs (where data for a given excitation frequency "fork") at about the same value of voltage, ~190 V. Notice that, for a constant voltage, the RMS current increases with AC frequency, which means that the brightness of the array can be controlled with the excitation frequency. The labeling at the top of the figure indicates the average power dissipated per pixel. These values range from ~0.5 to 1.25 mW/pixel which translates to 500 W to ~1 kW for an array consisting of 1 million pixels. It is expected that these power dissipation levels can be lowered by approximately an order of magnitude by coating the anode with dielectric layer 250, as well. The data for a higher Ne pressure (700 Torr, FIG. 4) show a slightly lower power dissipation/pixel, a favorable result since operating the arrays at one atmosphere is optimal for packaging reasons.

Figure 5:
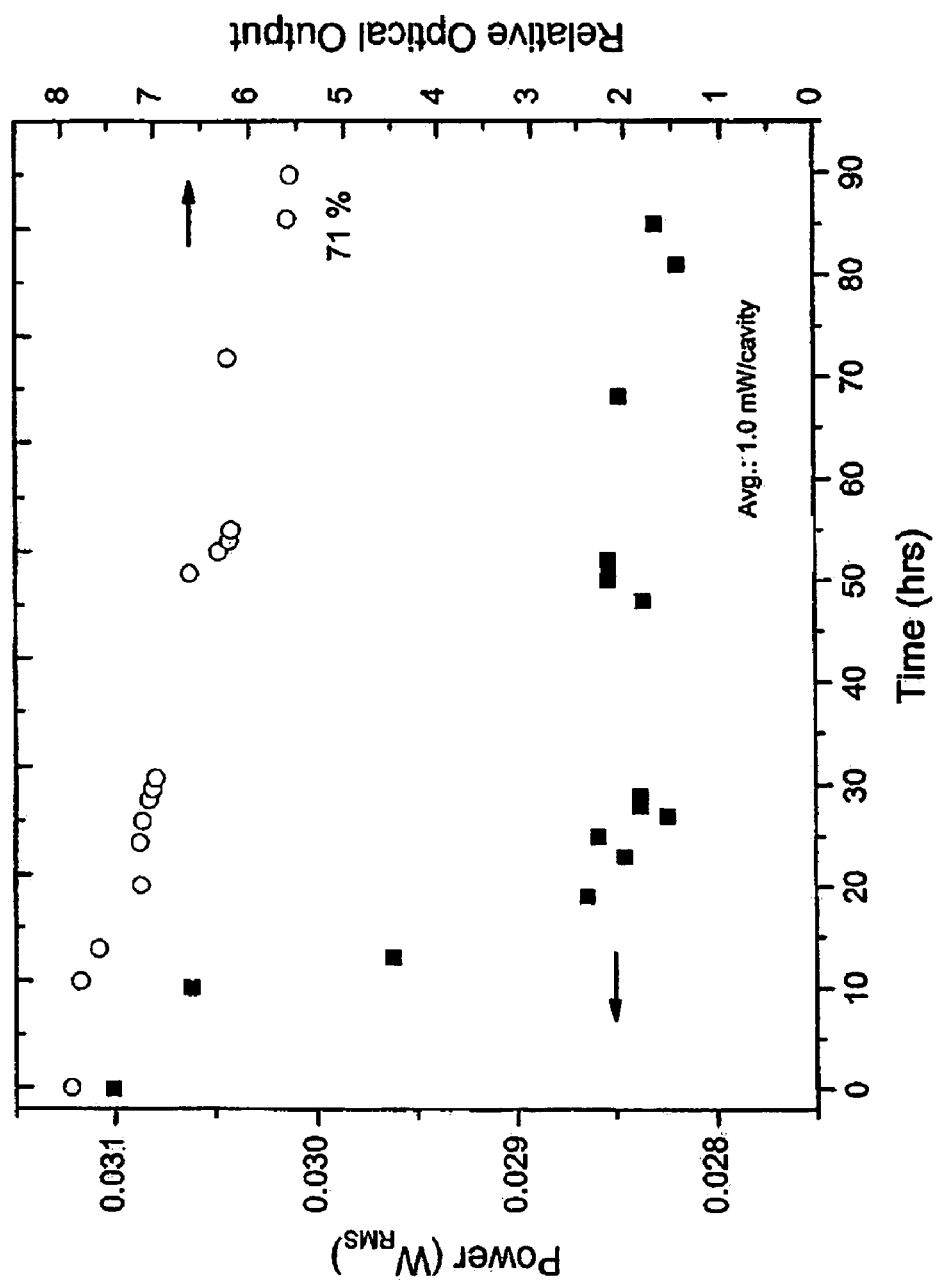
FIG. 5 shows initial lifetime data for a 27 pixel array.

Preliminary lifetime data for arrays having 27 pixels and operating at 5 kHz in Ne are shown in FIG. 5. After ~100 hours of continuous operation, the output power drops to 71% of its initial output but it appears that most of this decline is due to poisoning of the gas by the exposed electrode. More sophisticated cleaning of the pixels before operating and covering the remaining electrode will likely extend the array lifetime dramatically.

Figure 6:
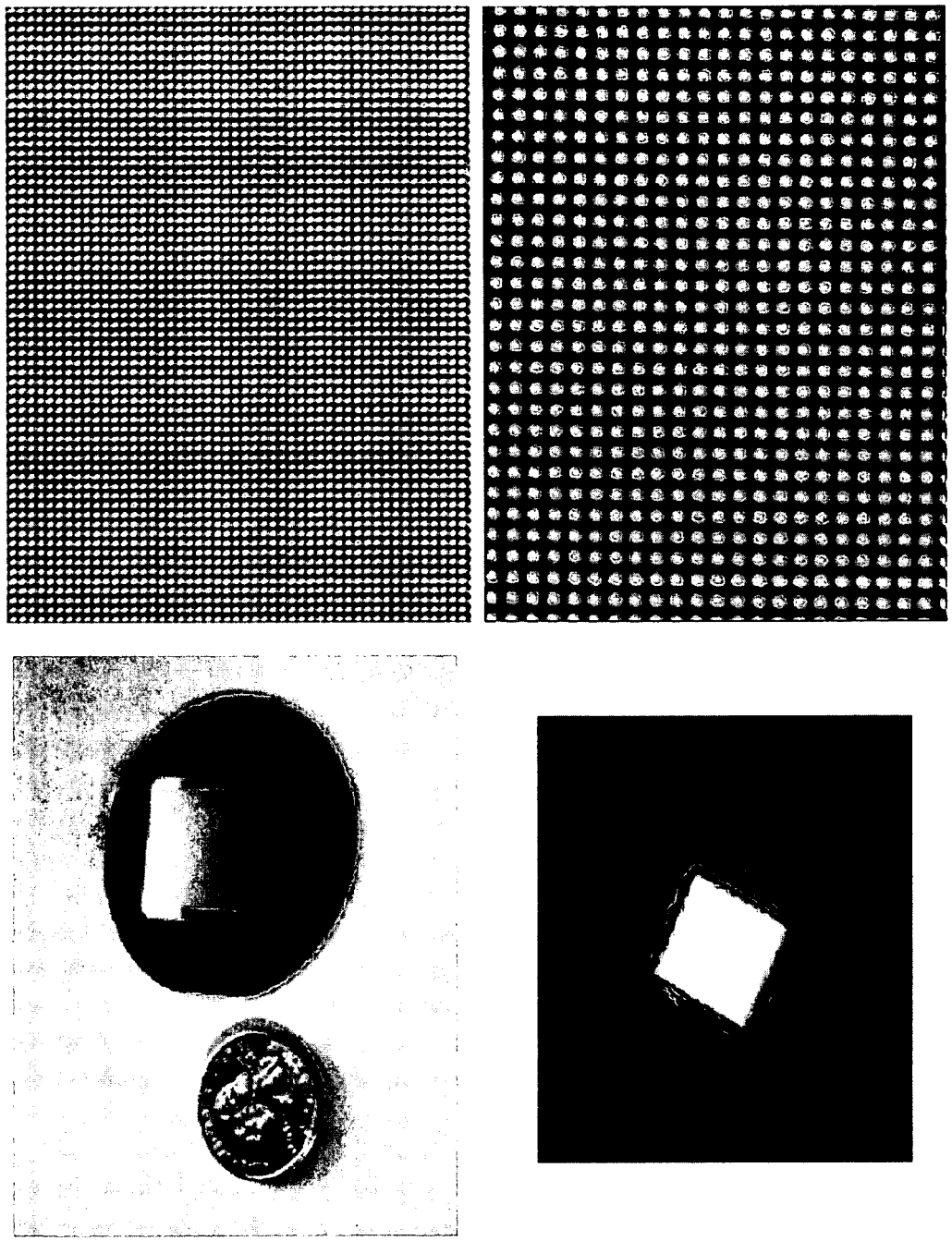
FIG. 6 shows optical micrographs (right) and photographs (left) of a 40,000 pixel microdischarge device array fabricated according to the process of FIG. 1.

FIG. 6 shows optical micrographs of microdischarge device arrays fabricated as described in connection with FIG. 1. A 200×200 pixel array comprises pixels having inverted square pyramidal microcavities, produced by wet chemical etching in p-type Si wafers ($\rho$~6-8 $\Omega$-cm). A cross-sectional diagram of a single pixel is illustrated by FIG. 2. At the upper surface of the Si substrate, the dimensions of the pyramidal microcavity are 50×50 $\mu m^2$. The tip of each pyramid microcavity lies ~35 $\mu$m below surface 214 of the Si substrate 210. After depositing 2 $\mu$m of silicon nitride over the entire Si structure by plasma-enhanced chemical vapor deposition, an opening is etched in the dielectric on the backside of the substrate to accommodate an electrical contact. Around the perimeter of the microcavity aperture, ~10 $\mu$m of a dry etchable polyimide and 0.2 $\mu$m of Ni are deposited, the latter of which serves as a second electrode. Depositing a second film of silicon nitride, typically 2-5 $\mu$m in thickness, over the microcavity and substrate surface completes the device. After evacuating a finished array to ~$10^{-7}$ Torr and backfilling with Ne, an AC (sinusoidal) voltage with a frequency of 5-20 kHz is imposed between the Si substrate and Ni electrode. All experiments have been carried out at room temperature with Ne at a static pressure.

Figure 7:
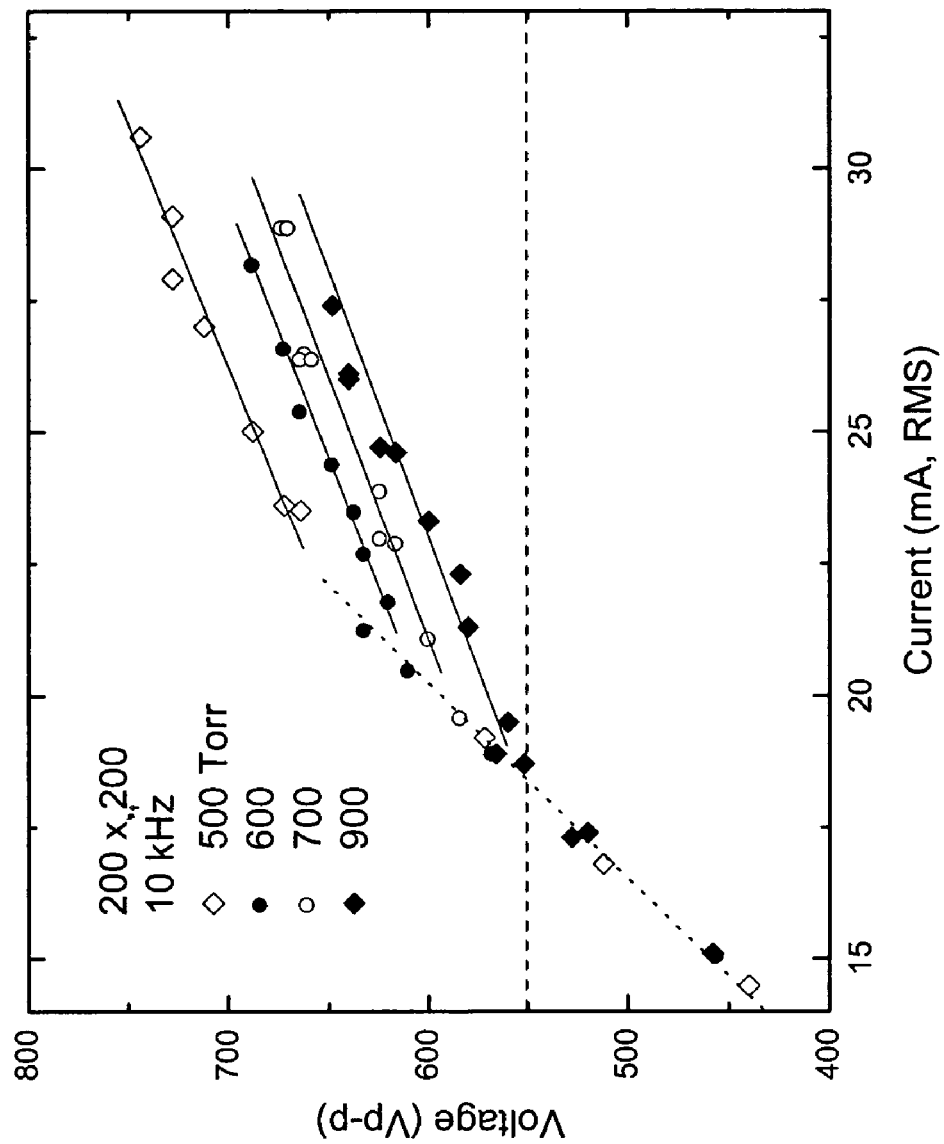
FIG. 7 shows voltage-current (V-I) characteristics for a 200×200 pixel array, operating in 500-900 Torr of Ne, excited at a frequency of 10 kHz and fabricated according to the design of FIG. 2.

Voltage-current (V-I) characteristics for a 200×200 pixel array (again, (50 $\mu$m)$^2$ devices), operating in 500-900 Torr of Ne and excited at a frequency of 10 kHz, are shown in FIG. 7. All voltages are expressed in terms of their peak-to-peak (p-p) values and the dashed horizontal line indicates the voltage (±1 V) at which the array ignites when $P_{Ne}$=900 Torr. Measurements of the dependence of the array operating voltage on $p_{Ne}$ show a monotonic decline with increasing pressure for $500 \leq p_{Ne} \leq 900$ Torr, regardless of whether the driving frequency is 5, 10, or 15 kHz. For 500 Torr of Ne, the peak-to-peak operating voltages range from ~725 to 785 V for 5 and 15 kHz, respectively, but fall to 660-680 V for $p_{Ne}$=900 Torr. Although only a slight variation in the radiative output power is observed over this pressure range, maximum radiative efficiency occurs for $p_{Ne}$ at about 700 Torr and an excitation frequency of 10-15 kHz.

Returning to FIG. 6, several photographs of one of the 4×10$^4$ (200×200) pixel arrays fabricated to date are presented. The left-hand portion of the figure shows (top) the completed structure, fabricated in a 50 mm (2 inch) diameter Si (100) wafer, and the lower photograph is that of an array operating in 700 Torr of Ne at an excitation frequency of 10 kHz, and drawing ~30 mA of current. A prominent characteristic of these arrays, exemplified by the optical micrographs on the right side of FIG. 6, is the pixel-to-pixel emission uniformity. Acquired with a telescope and a CCD camera, these images show portions of the array in operation and at two values of magnification. A false color image of the intensity contour produced by a 17×13 pixel segment of a 200×200 array is illustrated in FIG. 8. A neutral density filter inserted into the optical path to the CCD camera ensured that the image is not saturated. In the lower portion of FIG. 8 is a superposition of several "lineouts" from the digital image at the top of the figure. These lineouts, obtained from columns and rows of pixels, show that the pixel-to-pixel peak emission intensity is reproducible and uniform to within ±10%.

Figure 9:
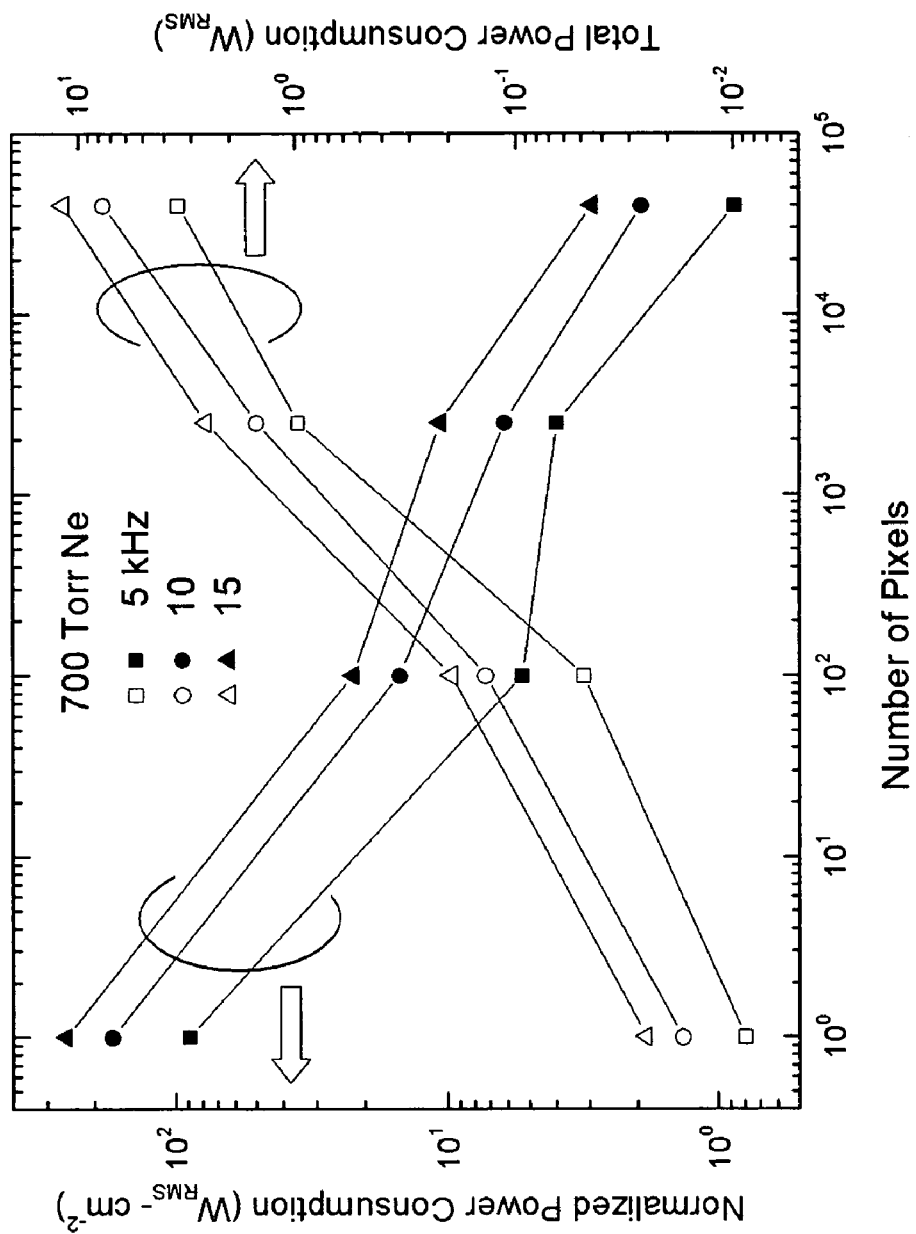
FIG. 9 shows the variation of the device, and array power consumption, with the number of pixels for devices fabricated according to the process of FIG. 1.

FIG. 9 shows the variation of the device and array power consumption with the number of pixels. Results are given for a single device as well as 10×10, 50×50, and 200×200 pixel arrays. The right-hand ordinate and open points (i.e., "o") indicate the total power dissipated by the array (or single pixel), whereas the solid points (associated with the left-hand ordinate) present the data as normalized to the emitting area of the array. Although the total power consumed by an array grows with its size, the power dissipated per pixel is almost two orders of magnitude larger for a single pixel than that for the 200×200 array. Current flow in the thin (~0.2 $\mu$m) Ni film anode presently in use is apparently a factor in this result and for those applications requiring large arrays and greater optical output power/pixel, employing a thicker, possibly electroplated, anode will be of value.

AC excitation of microdischarge devices offers several clear advantages with respect to DC-driven microplasma arrays, particularly when device lifetime is of primary importance. Since at least one dielectric layer (such as those in FIG. 2) provides a physical barrier between the plasma and electrode, erosion of the cathode by ion bombardment or the anode by electron sputtering is minimized.

Herein, and in any appended claims, we refer to a body as "flexible" if it can be bent without fracture in a radius of curvature no larger than 10 cm. A "fracture" will denote a break in a body due to deformation. "Upper" and "lower" and "above" shall be relative terms for convenience of description and without limitation as to the orientation of that body in space.

Figure 10:
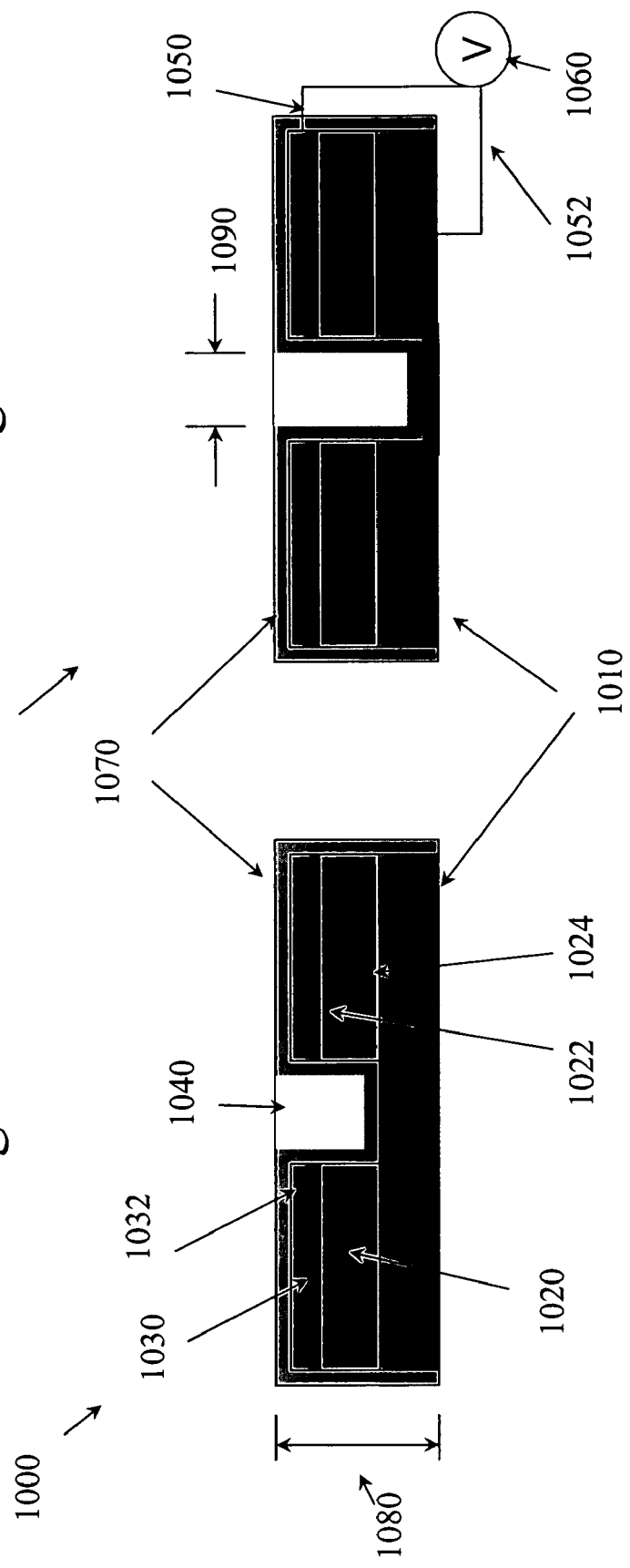
FIG. 10 shows a cross-sectional diagram of a flexible microdischarge device according to an embodiment of the invention.
Figure 11:
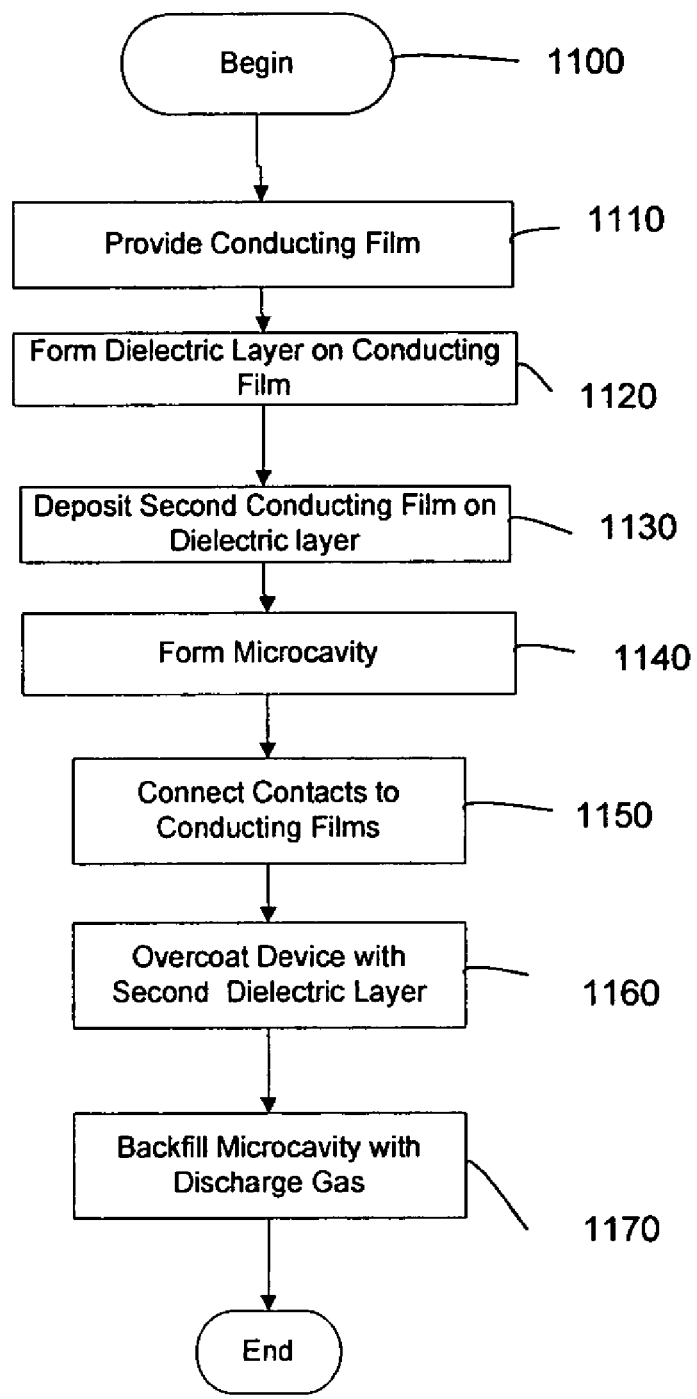
FIG. 11 is a flow diagram of a process for fabricating a flexible microdischarge device according to an embodiment of the present invention.

In another embodiment of the present invention, a process is provided for forming a microcavity discharge device that can flex in one or more directions. Exemplary structures 1000, 1001 for the device are shown in FIG. 10, and FIG. 11 is a flow diagram for the process 1100. A first electrically conducting film or substrate 1010 is provided 1110 and is then overcoated 1120 with a first dielectric layer 1020. The first dielectric layer includes a first face 1022 and a second face 1024. A second electrically conducting film 1030 is deposited 1130 on the first face 1022 of the first dielectric layer. A microcavity 1040 is then formed 1140 with an opening to the first face 1032 of the second conducting layer. The microcavity may be formed by microdrilling, chemical etching, laser machining, etc. Also, photolithographic and etching or photoablation techniques well known in the VLSI and MEMs communities may be used to fabricate arrays of microcavities. The microcavity will generally extend at least to the first dielectric layer 1020, as shown in FIG. 10A and, in some embodiments, may extend to the first conducting film 1010, as shown in FIG. 10B, or even extend completely through substrate 1010. Electrical contacts 1050, 1052 may be connected 1150 to each of the first and second conducting films, forming first and second electrodes. A second dielectric layer 1070 may be deposited 1160 on the face 1032 of the second conducting layer that is distal to the first dielectric layer, and on the interior surface of the microcavity. The materials and thicknesses of the layers may be such that the device is flexible. In some embodiments, flexibility is limited to flexing in a direction perpendicular to the faces of the layers, while in other embodiments such flexibility may also include the direction transverse to the faces of the layers.

In another specific embodiment of the invention, instead of depositing a conducting layer on the dielectric layer 1020, a second electrode is disposed above the first face 1022 of the first dielectric layer 1020. The second electrode may be coated with a dielectric layer. In other embodiments of the invention, one or more of the dielectric layers may be replaced by other non-conducting layers or structures.

In a specific embodiment of the invention, the overall thickness of the device is approximately 50 µm and the characteristic dimension of the microcavity opening is approximately 50-100 µm.

After any of the device structures described above are formed, the device may be evacuated by a vacuum system and may be heated under vacuum to de-gas the structure. Subsequently, the microcavity (or microcavities) in the device (or array of devices) may be backfilled 1170 with a desired gas or vapor. It is then generally desirable to seal the device or array (depending upon the materials chosen) by one of a variety of well-known processes such as anodic bonding, lamination or sealing with epoxy. A microplasma discharge may be ignited in the cavity by applying a time-varying (AC, pulsed DC, etc.) excitation potential (of the appropriate magnitude) between the electrodes.

Figure 12:
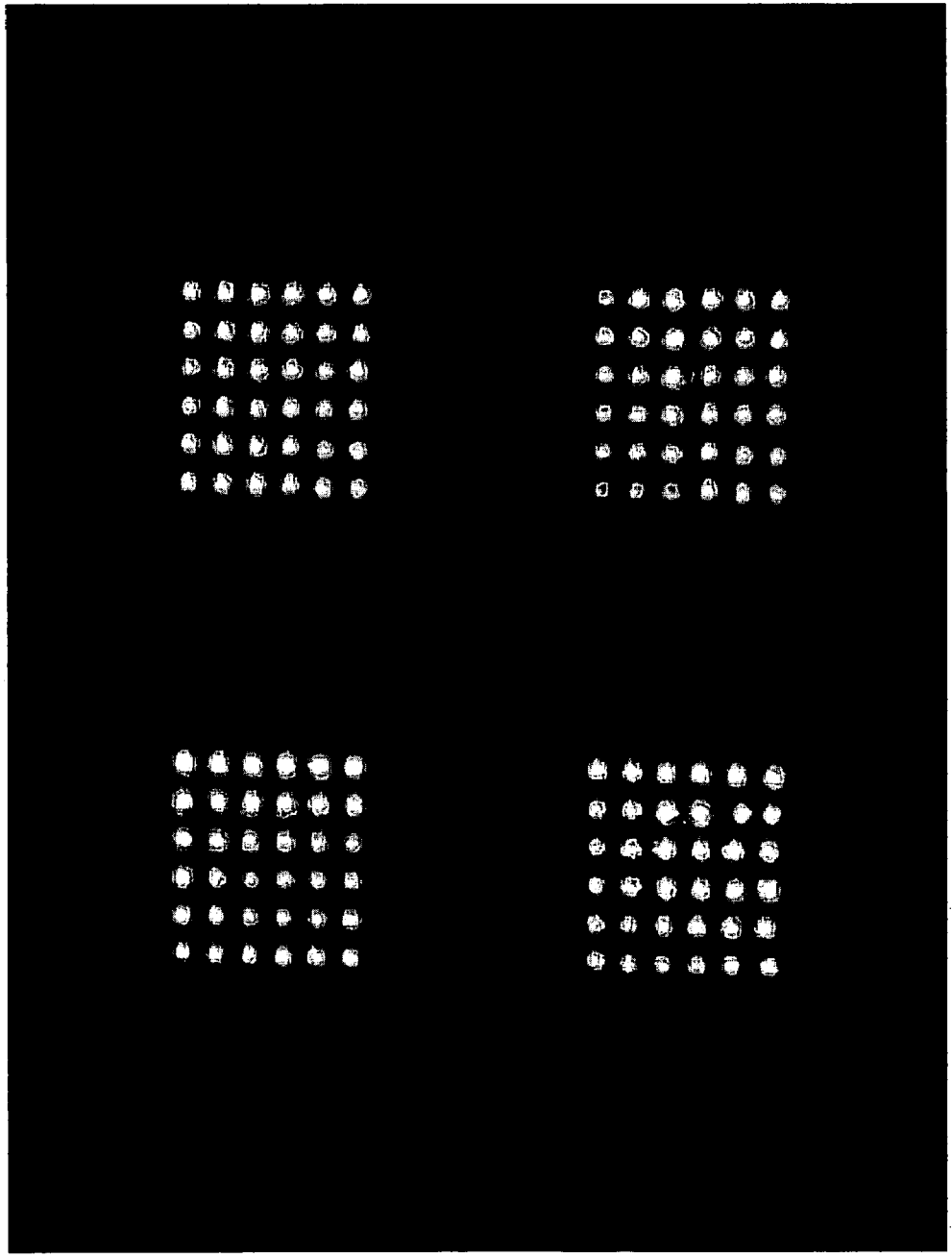
FIG. 12 is an optical micrograph of arrays of devices fabricated by the process of FIG. 11.
Figure 13:
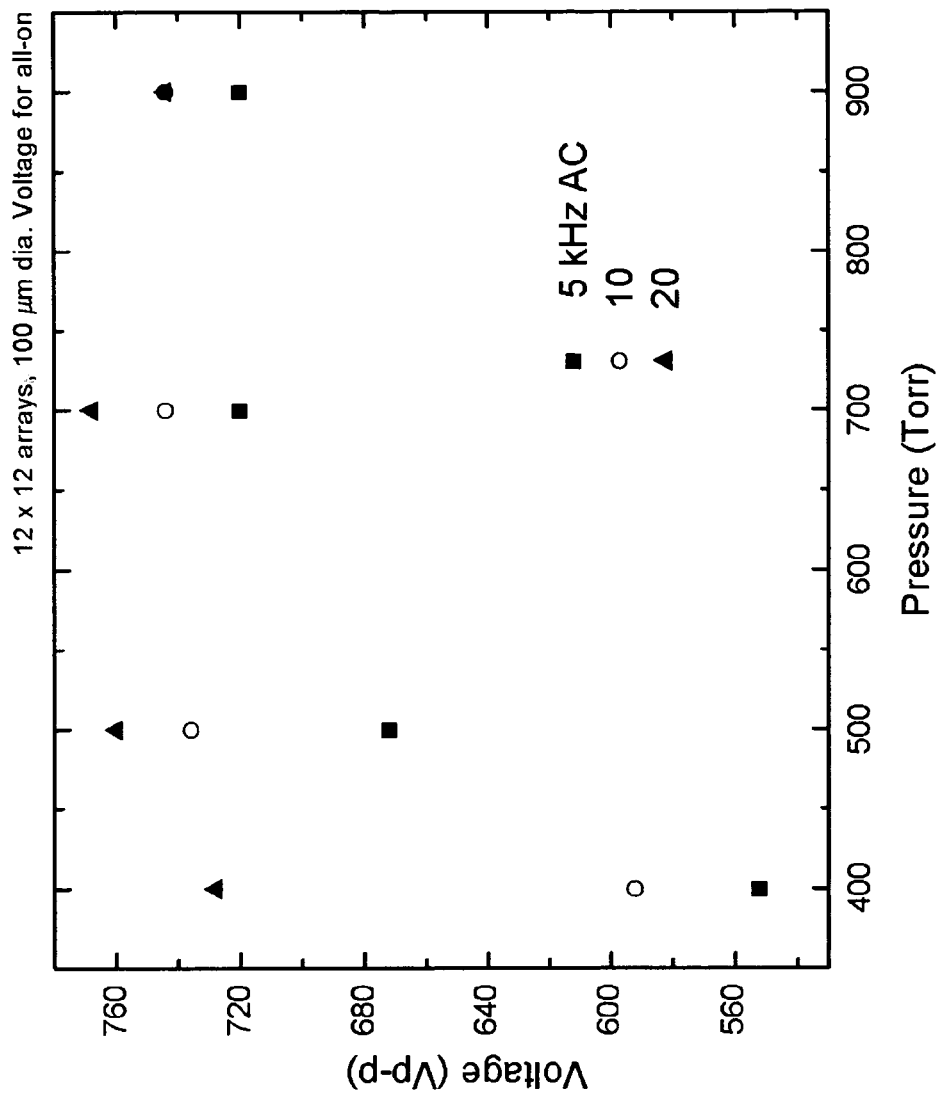
FIG. 13 is a graph showing operating voltages for a 12×12 pixel array of the device of FIG. 10.
Figure 14:
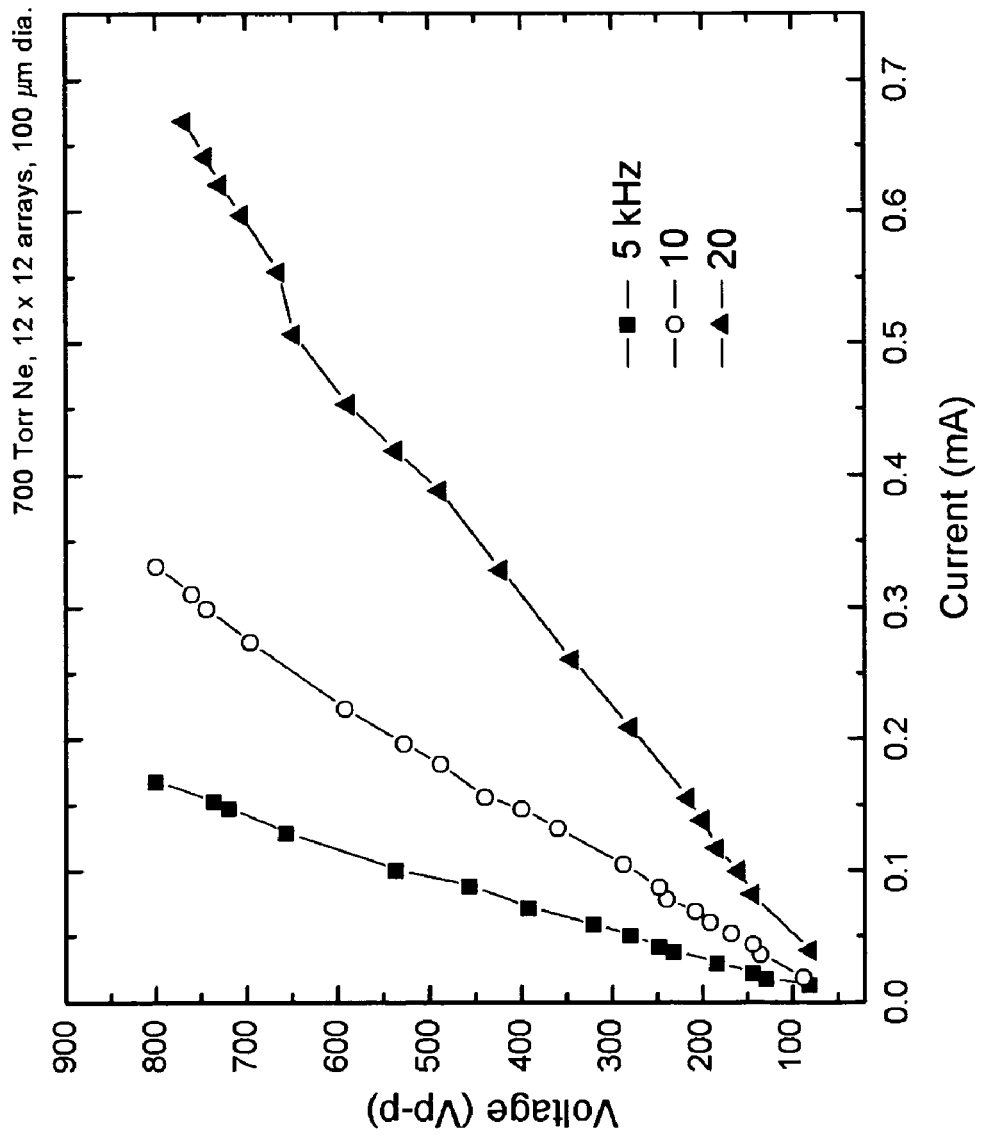
FIG. 14 is a graph of voltage-current (V-I) characteristics for a 12×12 pixel array of the device of FIG. 10, filled with Ne gas at 700 Torr.
Figure 15:
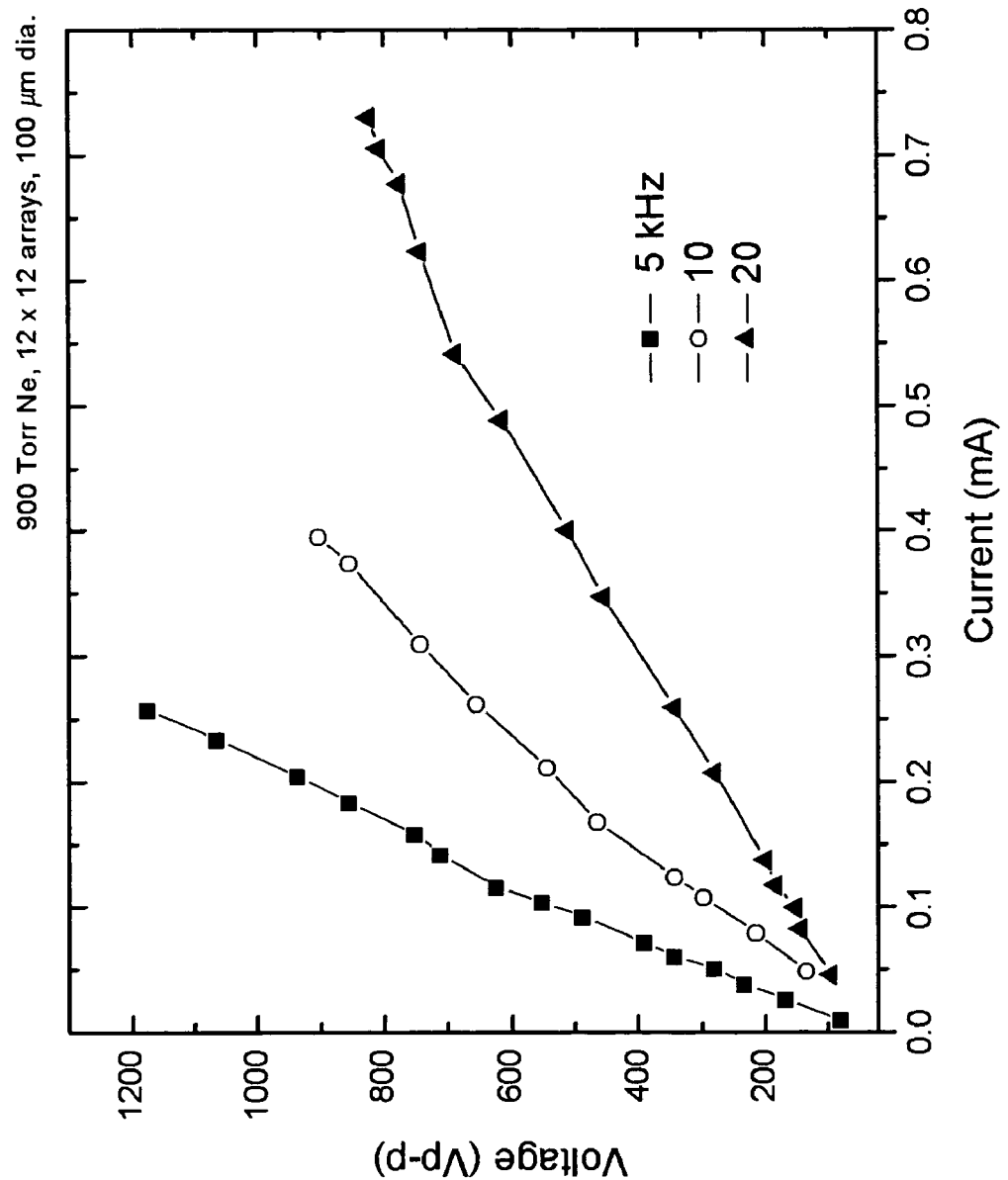
FIG. 15 is a graph of voltage-current (V-I) characteristics for a 12×12 pixel array of the device of FIG. 10, filled with Ne gas at 900 Torr.

A number of these devices have been fabricated and characterized. FIG. 12 is an optical micrograph of arrays of devices fabricated by the process of FIG. 11. A prominent characteristic of these arrays is, as noted previously in connection with another microcavity discharge device structure, the pixel-to-pixel emission uniformity. Another attractive aspect of this device structure is its robust behavior. Tests have shown, for example, that layer 1030 in FIG. 10A can be scratched, microcavity 1040 can be of irregular cross-section from pixel to pixel, and the microcavity extending completely through film (or substrate) 1010, and yet the devices will still work well. The presence of dielectric layer 1070, typically 1 µm or more in thickness, is a key factor in this result. FIG. 13 is a graph showing the peak-to-peak "turn on" voltage for a 12×12 pixel array of the device of FIG. 10B as a function of the pressure of the discharge gas. Each microcavity is approximately 100 µm in diameter and results are shown for three values of AC (sinusoidal) excitation frequency. FIG. 14 shows the voltage-current (V-I) characteristics for the 12×12 arrays of FIG. 13 at a Ne pressure of 700 Torr. The microcavities are filled with Ne gas at 700 Torr and discharges are excited at several AC frequencies. FIG. 15 is a graph of voltage-current (V-I) characteristics for the 12×12 pixel arrays of the device of FIG. 10B, but for a Ne gas pressure of 900 Torr.

Returning to FIG. 2, in another embodiment of the invention, the first and second dielectric layers, 220 and 250, can be chosen for their optical, as well as electrical (and protective) characteristics. If the microdischarge in microcavity 212 is producing one or more wavelengths of interest and extracting that light from the microcavity efficiently is important, the materials chosen for layers 220 and 250, as well as their thicknesses, can be selected to act as a mirror. Dielectric mirrors comprising a stack of dielectric films in which the index of refraction alternates from "high" to "low" are well-known in the art. Mirrors manufactured for lasers generally have an odd number of dielectric layers and a structure denoted (HL)"H where H denotes a layer of the high index dielectric, L a layer of the low index dielectric, and n the number of pairs of layers. The dielectric mirror used for layers 220 and 250 can be chosen to have appropriate indices of refraction and layer thicknesses so that high reflectivity is realized at the wavelength(s) (and viewing angle) of interest. In addition to silicon dioxide, other dielectrics having good electrical properties that are also useful for mirrors are silicon nitride, polyimides, and titanium dioxide. At a wavelength of 500 nm, the indices of refraction of $SiO_2$, $Si_3N_4$, polyimide, and $TiO_2$ films are ~1.45, ~2.0, ~1.6-1.8 (depending upon the polyimide structure) and ~2.62, respectively. The two layer "stack" (layers 220 and 250 of FIG. 2) will yield significant reflectivities in the visible when a suitable dielectric is used. If higher reflectivity is desired, one or more additional dielectrics can be deposited onto layer 250 in FIG. 2. It should also be noted that the reverse is also true—namely, the first and second (as well as additional) dielectric layers can be designed to suppress the emission of a specific range of wavelengths from the microcavity. The design of multi-dielectric layer reflective or "bandstop" coatings is well known in the optics community. Similar techniques can be used for the flexible microcavity discharge devices described above, such as the device shown in FIG. 10.

Similarly, it is of course apparent that the present invention is not limited to the aspects of the detailed description set forth above. Various changes and modifications of this invention as described will be apparent to those skilled in the art without departing from the spirit and scope of this invention as defined in the appended claims.

We claim:

1. A microdischarge device comprising:
 a conducting substrate including at least one microcavity opening to a first face of the substrate;
 a dielectric layer substantially covering the first face of the substrate and the interior surface of the microcavity;
 an electrical contact coupled to a second face of the substrate forming a first electrode; and
 a second electrode disposed distally to the dielectric layer for application of a time-varying potential across the first and second electrodes.

2. A device according to claim 1, wherein the dielectric layer includes a layer consisting of a first dielectric and a layer consisting of a second dielectric.

3. A device according to claim 1 wherein the microcavity extends to the second face of the substrate.

4. A device according to claim 1, wherein the substrate is a semiconductor.

5. A device according to claim 1, wherein the substrate is one of a metal and a polymer.

6. A device according to claim 1, wherein the second electrode is a dielectric-coated screen.

7. A device according to claim 1, wherein the second electrode is covered with a second dielectric layer.

8. A device according to claim 1, wherein the microcavity is one of trapezoidal, rectangular, and cylindrical in cross-section.

9. A method for manufacturing a microdischarge device, the method comprising:
 providing a conducting substrate, the substrate including at least one microcavity, the microcavity including an opening to a first face of the substrate;
 connecting an electrical contact to a second face of the substrate, forming a first electrode;
 depositing a first dielectric layer on the substrate and within the microcavity;
 providing a second electrode adjacent to the microcavity opening and disposed distally to the first dielectric layer; and
 filling the microcavity with a specified gas.

10. A method according to claim 9, wherein the microcavity extends to the second face of the substrate.

11. A method according to claim 9, further including:
 depositing a second dielectric layer, the second dielectric layer substantially covering the second electrode.

12. A method according to claim 9, further including:
depositing a second dielectric layer on the first dielectric layer; and
selecting the material and thickness of the first and second dielectric layers such that light emission increases at a given wavelength.

13. A method according to claim 9 further including:
depositing a second dielectric layer on the first dielectric layer; and
selecting the material and thickness of the first and second dielectric layers such that light emission decreases at a given wavelength.

14. A method according to claim 9 wherein providing the second electrode includes depositing a conductor on the first dielectric layer, forming the second electrode.

15. A method according to claim 14 further including:
forming a second dielectric layer over the second electrode.

16. A method according to claim 9 wherein providing the second electrode includes providing a screen.

17. A method according to claim 9 further including:
f. forming at least one microcavity in the substrate.

18. A method according to claim 17, wherein at least one microcavity is formed by wet etching.

19. A method according to claim 17, wherein at least one microcavity is formed by micromachining.

20. A method according to claim 9, wherein the substrate is a semiconductor.

21. A method according to claim 9, wherein the substrate is one of a metal layer and a polymer.

22. A microdischarge device comprising:
a non-conducting substrate, the substrate including first and second faces, the substrate coated with a conducting layer on each face, thereby forming first and second electrodes;
a microcavity opening to the first face of the substrate;
a dielectric layer substantially coating the conducting layer and the microcavity on the first face; and
a gas contained within the microcavity
such that a microdischarge is produced upon application of a time-varying potential across the first and second electrodes.

23. A microdischarge device according to claim 22 wherein the microcavity extends into the conducting layer on the second face of the substrate.

24. A microdischarge device according to claim 22, wherein the device is flexible.

25. A method for manufacturing a microdischarge device, the method comprising:
providing a non-conducting substrate, the substrate including first and second faces, the substrate coated with a conducting layer on each face, thereby forming first and second electrodes;
forming a microcavity in the first face of the substrate;
substantially coating the conducting layer and the microcavity on the first face with a non-conducting layer; and
filling the microcavity with a specified gas.

26. A method according to claim 25, wherein the microdischarge device is flexible.

27. A method according to claim 26, further including:
applying a time-varying potential between the electrodes such that a microdischarge is ignited in the microcavity.

28. A method according to claim 25, wherein forming the microcavity includes extending the microcavity to the conducting layer on the second face of the substrate.

29. A method according to claim 25, further including:
selecting the material and thickness of the non-conducting substrate and the non-conducting layer such that light emission increases at a given wavelength.

30. A method according to claim 25, further including:
selecting the material and thickness of the non-conducting substrate and the non-conducting layer such that light emission decreases at a given wavelength.

31. A method according to claim 25, wherein the microcavity formed has a characteristic dimension of approximately 50 μm to 100 μm.

32. A microdischarge device comprising:
a flexible non-conducting substrate having a lower face and an upper face, the lower face conductively coated, thereby forming a first electrode, and the upper face substantially parallel to the lower face, the substrate having a microcavity opening to the upper face of the substrate;
a second electrode disposed above the upper face for application of a time-varying electrical potential across the first and second electrodes;
a dielectric layer substantially coating the second electrode and the microcavity; and
a gas contained within the microcavity for supporting a microdischarge upon application of the potential.

* * * * *

UNITED STATES PATENT AND TRADEMARK OFFICE
CERTIFICATE OF CORRECTION

PATENT NO. : 7,477,017 B2  Page 1 of 1
APPLICATION NO. : 11/042228
DATED : January 13, 2009
INVENTOR(S) : Eden et al.

It is certified that error appears in the above-identified patent and that said Letters Patent is hereby corrected as shown below:

On the Title Page:

| | |
|---|---|
| Page 3, Col. 2, Line 13 | Reference of J.G. Eden et al., Nov. 2003<br>Please delete "Microplasms" and insert --Microplasma-- in its place. |
| Col. 5, Line 41 | Please delete "$P_{Ne}$" and insert --$p_{Ne}$-- in its place. |
| Col. 7, Line 58 | Please delete "$(HL)^nH$" and insert --$(HL)^nH$-- in its place. |
| Claim 17, Col. 9, Line 22 | Please delete "f." at the beginning of line 2 of claim 17. |

Signed and Sealed this

Ninth Day of June, 2009

JOHN DOLL
*Acting Director of the United States Patent and Trademark Office*